(12) United States Patent
Logunov et al.

(10) Patent No.: US 9,281,132 B2
(45) Date of Patent: Mar. 8, 2016

(54) METHOD FOR SEALING A LIQUID WITHIN A GLASS PACKAGE AND THE RESULTING GLASS PACKAGE

(71) Applicant: CORNING INCORPORATED, Corning, NY (US)

(72) Inventors: Stephan Lvovich Logunov, Corning, NY (US); Joseph Francis Schroeder, III, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 14/854,671

(22) Filed: Sep. 15, 2015

(65) Prior Publication Data

US 2016/0005548 A1    Jan. 7, 2016

Related U.S. Application Data

(63) Continuation of application No. 13/055,328, filed on Jan. 21, 2011, now Pat. No. 9,165,719.

(60) Provisional application No. 61/084,007, filed on Jul. 28, 2008.

(51) Int. Cl.
*H01J 9/00* (2006.01)
*F21K 99/00* (2010.01)
*H01G 9/20* (2006.01)
*H01L 51/52* (2006.01)

(52) U.S. Cl.
CPC .......... *H01G 9/2077* (2013.01); *H01L 51/5246* (2013.01)

(58) Field of Classification Search
CPC .......... H01G 9/2077; C03C 8/08; C03C 8/10; C03C 8/24; C03C 8/245; C03C 27/06; H01L 51/5237
USPC ....................................... 313/512; 445/23–25
See application file for complete search history.

(56) References Cited

U.S. PATENT DOCUMENTS

| | | | |
|---|---|---|---|
| 5,757,345 A | 5/1998 | Sheridon | |
| 5,852,878 A | 12/1998 | Seipp, Jr. et al. | |
| 6,998,776 B2 | 2/2006 | Aitken et al. | |
| 7,371,143 B2 | 5/2008 | Becken et al. | |
| 7,407,423 B2 | 8/2008 | Aitken et al. | |

(Continued)

FOREIGN PATENT DOCUMENTS

| | | |
|---|---|---|
| JP | 10-172443 | 6/1998 |
| JP | 2000173868 | 6/2000 |

(Continued)

OTHER PUBLICATIONS

A. Hinsch, et al., "Long-Term Stability and Efficiency of Dye-Sensitized Solar Cells," Netherlands Energy Research Foundation ECN, Freiburg Materials Research Center, and Solaronix SA, pp. 1-4.

(Continued)

*Primary Examiner* — Joseph L Williams
(74) *Attorney, Agent, or Firm* — Jason A. Barron

(57) ABSTRACT

A method for sealing a liquid within a glass package and the resulting sealed glass package are described herein where the sealed glass package can be, for example, a dye solar cell, an electro-wetting display or an organic emitting light diode (OLED) display.

20 Claims, 10 Drawing Sheets

(56) References Cited

U.S. PATENT DOCUMENTS

| | | |
|---|---|---|
| 7,838,314 B2 | 11/2010 | Choi et al. |
| 2001/0004901 A1 | 6/2001 | Yamanaka et al. |
| 2004/0188234 A1 | 9/2004 | Dove et al. |
| 2005/0001545 A1 | 1/2005 | Aitken et al. |
| 2006/0012296 A1 | 1/2006 | Eida et al. |
| 2006/0066224 A1 | 3/2006 | Ito |
| 2006/0082298 A1 | 4/2006 | Becken et al. |
| 2006/0084348 A1 | 4/2006 | Becken et al. |
| 2006/0160265 A1 | 7/2006 | Morii et al. |
| 2007/0002257 A1 | 1/2007 | Oh et al. |
| 2007/0128966 A1 | 6/2007 | Becken et al. |
| 2007/0138027 A1 | 6/2007 | Dinsmoor et al. |
| 2007/0170855 A1 | 7/2007 | Choi et al. |
| 2007/0241417 A1 | 10/2007 | Huibers et al. |
| 2008/0003483 A1 | 1/2008 | Tsunoda et al. |
| 2008/0171485 A1 | 7/2008 | Choi et al. |
| 2009/0009046 A1 | 1/2009 | Oh et al. |

FOREIGN PATENT DOCUMENTS

| | | |
|---|---|---|
| JP | 2006179218 | 7/2006 |
| JP | 2007263288 | 10/2007 |
| JP | 2010276167 | 12/2010 |

OTHER PUBLICATIONS

B. Wenger, et al., "Rationale for Kinetic Heterogeneity of Ultrafast Light-Induced Electron Transfer from Ru(II) Complex Sensitizers to Nanocrystalline TiO2," J. Am. Chem. Soc., 2005, pp. 12150-12151.

R. Sastrawan, et al., "A glass frit-sealed dye solar cell module with integrated series connections," Received Jun. 17, 2005, pp. 1-10.

R. Sastrawan, et al., "Towards Manufacturing Dye Solar Cells," Freiburg Materials Research Centre, Fraunhofer Institute for Solar Energy Systems, Institut für Angewandte Photovoltaik, PSE GmbH Solar Info Center, and Degussa AG, pp. 1-4.

Gratzel; "Mesoscopic solar cells for electricity and hydrogen production from sunlight"; Chemistry Letters, vol. 34, No. 1 (2005).

METHOD FOR SEALING A LIQUID WITHIN A GLASS PACKAGE AND THE RESULTING GLASS PACKAGE

CLAIM OF PRIORITY

This application is a continuation of U.S. patent application Ser. No. 13/055,328 filed on Jan. 21, 2011 which claims the benefit of priority under 35 U.S.C. §119 of U.S. Provisional Application Ser. No. 61/084,007 filed on Jul. 28, 2008 the content of which is relied upon and incorporated herein by reference in its entirety.

TECHNICAL FIELD

The present invention relates to a method for sealing a liquid within a glass package and the resulting sealed glass package. Some examples of such a sealed glass package include a dye solar cell, an electro-wetting display, and an organic light emitting diode (OLED) display.

BACKGROUND

The development and use of alternative energy sources has increased momentum in the past few years due at least in part to the current uncertainty in the Middle East and the rising cost of fossil fuels. One of the alternative energy sources that has been gathering research momentum involves the utilization of solar energy where the sun's photons are converted into electricity. Currently, the most widely used method for accomplishing this involves the use of silicon based photovoltaics. A relatively newer approach was discovered by Michael Grätzel who developed a new type of solar cell based on dye solar cell technology which involves the use of dye sensitized mesoscopic oxide particles. Today, the dye solar cell is commonly made by performing many steps which end with sealing one or more holes in a glass plate after a liquid electrolyte has been inserted through the hole(s) into a space between two electrode glass plates. Although this process for sealing the liquid electrolyte works it would be desirable to have a less expensive manufacturing process to make the dye solar cell. In fact, it would be desirable to have a less expensive manufacturing process to make many different types of glass packages that contain a liquid like, for example, an electro-wetting display and an OLED display. This need and other needs are satisfied by the method for sealing a glass package and the resulting glass package of the preset invention.

SUMMARY

In one aspect, the present invention includes a method for sealing a glass package by: (a) providing a first glass plate; (b) providing a second glass plate; (c) depositing a frit onto the first glass plate, where the frit forms a closed-loop on the first glass plate; (d) depositing a liquid within a space defined by an interior side of the frit and a surface of the first glass plate, where the liquid directly contacts at least the interior side of the frit; (e) placing the second glass plate on top of the frit on the first glass plate such that the liquid remains within the space defined by the interior side of the frit and the surface of the first glass plate; and (f) using a sealing device to heat the frit such that the frit melts and forms a seal which connects the first glass plate to the second glass plate and also contains the liquid between the first glass plate and the second glass plate.

In another aspect, the present invention includes a glass package with a first glass plate and a second glass plate, wherein the first glass plate and the second glass plate are connected to one another by a frit which forms a seal between the first glass plate and the second glass plate and also contains a liquid between the first glass plate and the second glass plate, wherein the frit is glass doped with at least one transition metal and a predetermined amount of coefficient of thermal expansion (CTE) lowering filler where the CTE lowering filler enables the liquid to penetrate the frit and be evaporated out of an interface between the frit and the second glass plate when the frit is melted to form the seal which connects the first glass plate and the second glass plate.

In yet another aspect, the present invention includes a sealing device that emits a light towards a glass package including a first glass plate and a second glass plate which are connected to one another by a frit, wherein the first glass plate and the second glass plate have a space between them defined by the frit in which a liquid is contained, and wherein the light heats the frit in a manner where a substantially constant temperature is maintained in the frit along a sealing line while the frit melts and forms the seal which connects the first glass plate to the second glass plate and also contains the liquid between the first glass plate and the second glass plate.

Additional aspects of the invention will be set forth, in part, in the detailed description, figures and any claims which follow, and in part will be derived from the detailed description, or can be learned by practice of the invention. It is to be understood that both the foregoing general description and the following detailed description are exemplary and explanatory only and are not restrictive of the invention as disclosed.

BRIEF DESCRIPTION OF THE DRAWINGS

A more complete understanding of the present invention may be had by reference to the following detailed description when taken in conjunction with the accompanying drawings wherein.

DETAILED DESCRIPTION

Figure 1A:
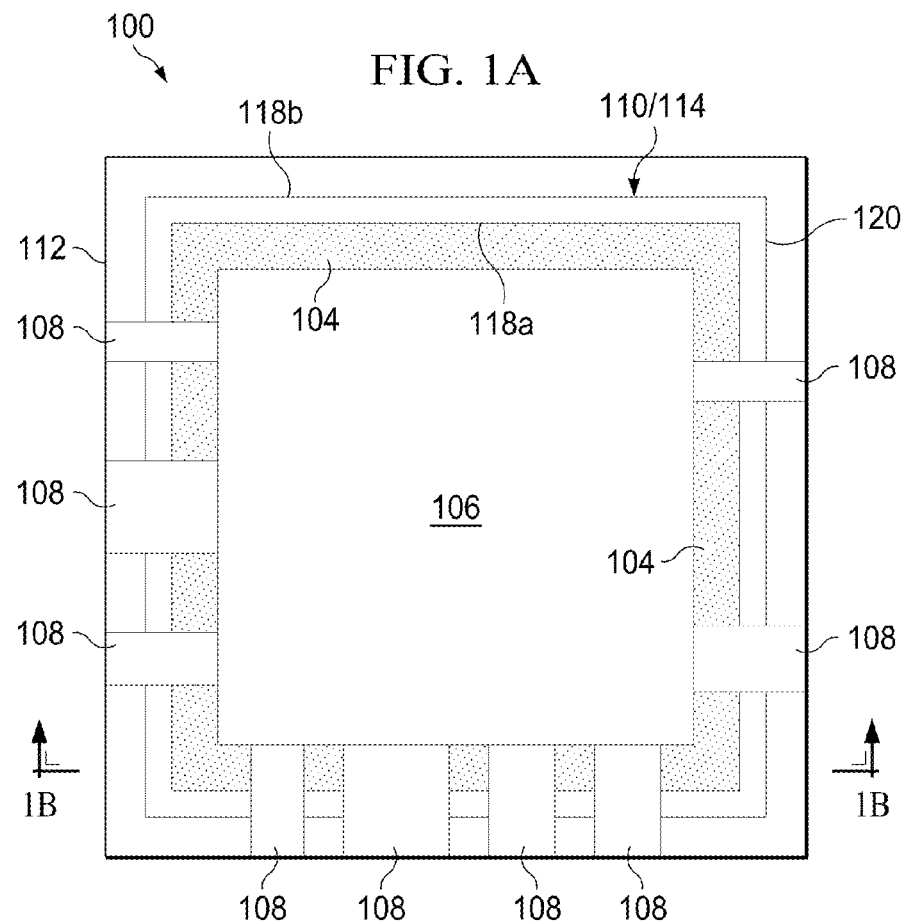
FIGS. 1A and 1B respectively illustrate a top view and a cross-sectional side view of a sealed glass package in accordance with the present invention.

Referring to FIGS. 1-5, there are disclosed a sealed glass package 100 and a method 200 for sealing the glass package 100 in accordance with the present invention. The sealing method 200 is described below with respect to sealing a glass package 100 that includes two glass plates 102 and 112 which contain a liquid 104 and possibly one or more components 106. For instance, the glass package 100 could be a dye solar cell 100 or an electro-wetting display 100. In addition, the sealing method 200 could be used to seal an OLED display 100 with a liquid 104 located therein assuming the liquid 104 does not degrade the OLEDs 106 where the presence of the liquid 104 would fill the gap between the substrates, thereby supporting the glass and reducing problematical Newton rings and avoiding problematical sag and touch issues commonly associated with large sized non-liquid containing OLED displays. Accordingly, the present invention should not be construed to be limited to any specific type of liquid containing sealed glass package.

Figure 1B:
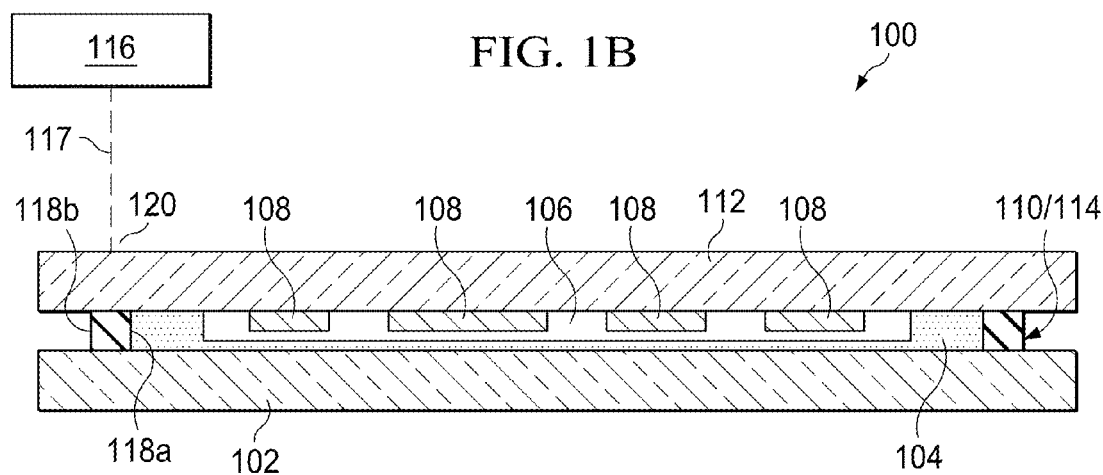

Referring to FIGS. 1A and 1B, there are a top view and a cross-sectional side view illustrating the basic components of the sealed glass package 100 in accordance with the present invention. The sealed glass package 100 includes a first glass plate 102, a liquid 104, one or more components-electrodes 106 and 108 (optional), a frit 110 and a second glass plate 112. The sealed glass package 100 has a seal 114 (e.g., hermetic seal 114) formed from the frit 110 which contains the liquid 104 and protects the one or more components 106 (if present) located between the first glass plate 102 and the second glass plate 112. The electrode(s) 108 (if present) are connected to the component(s) 106 and also pass through the seal 114 so they can be connected to an external device (not shown). The seal 114 is typically located around the perimeter of the glass package 100 such that the liquid 104, the component(s) 106 (if present) and at least a part of the electrode(s) 108 (if present) are located within the perimeter of the seal 114. How the seal 114 is formed by melting the frit 110 and the ancillary components such as a sealing device 116 (e.g., laser 116 or infrared lamp 116) which are used to heat and melt the frit 110 to form the seal 114 are described in greater detail below with respect to FIGS. 2-5.

Figure 2:
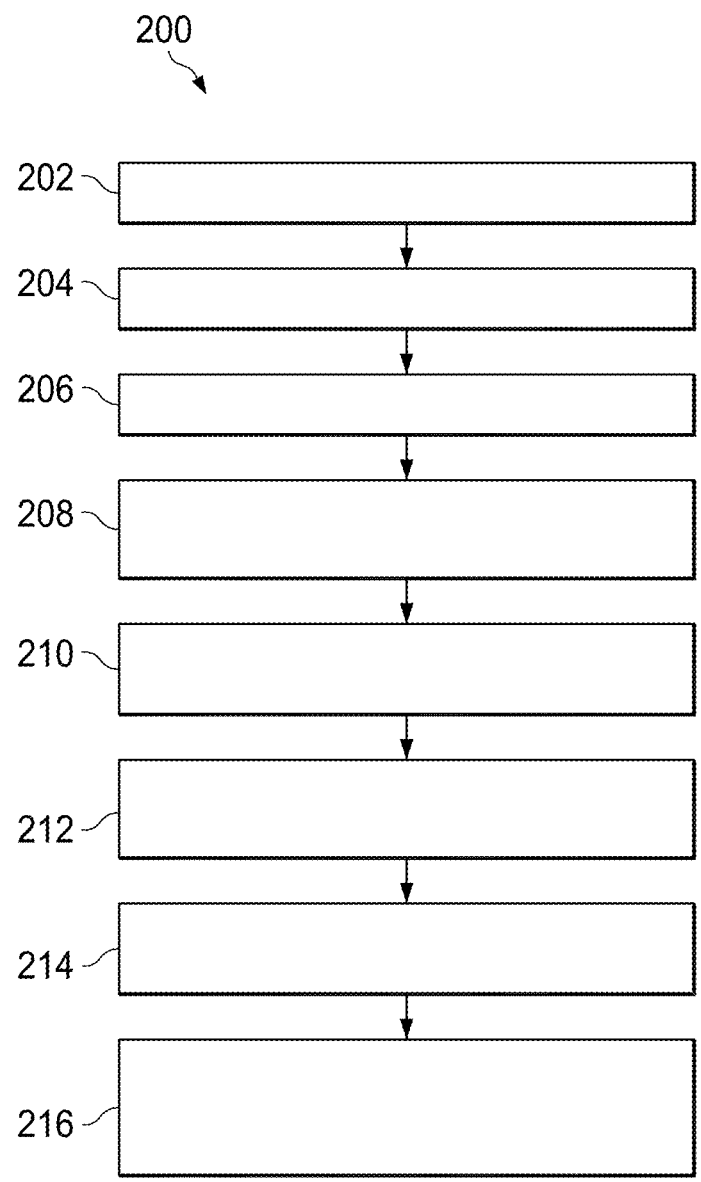
FIG. 2 is a flowchart illustrating the steps of a method for manufacturing the sealed glass package in accordance with the present invention.

Referring to FIG. 2, there is a flowchart illustrating the steps of the method 200 for manufacturing the sealed glass package 100 in accordance with the present invention. Beginning at steps 202 and 204, the first glass plate 102 and the second glass plate 112 are provided so that one can make the sealed glass package 100. In one embodiment, the first and second glass plates 102 and 112 are transparent glass plates such as soda lime glass plate or glass plates like the ones manufactured and sold by Corning Incorporated under the brand names of Code 1737 glass or Eagle 2000™ glass. Alternatively, the first and second glass plates 102 and 112 can be transparent glass plates like the ones manufactured and sold by companies like Asahi Glass Co. (e.g., OA10 glass and OA21 glass), Nippon Electric Glass Co., NHTechno and Samsung Corning Precision Glass Co. (for example). If desired, either or both of the glass plates 102 and 112 could be non-transparent. In addition, the glass plates 102 and 112 could have a coefficient of thermal expansion (CTE) in the range of $32-90 \times 10^{-7}$ per deg C. where in a display application one could use more expensive low CTE glasses while in a solar cell application one could use cheaper higher CTE glasses.

At step 206, the frit 110 is deposited along the edges of the first glass plate 102 in a manner that the frit 110 forms a closed-loop on a surface of the first glass plate 102. For instance, the frit 106 can be placed approximately 1 mm away from the free edges of the first glass plate 102. In one embodiment, the frit 110 is a low temperature glass frit that contains one or more absorbing ions (e.g., transition metals) chosen from the group including iron, copper, vanadium, and neodymium (for example). The frit 110 may also be doped with a filler (e.g., inversion filler, additive filler) which lowers the coefficient of thermal expansion (CTE) of the frit 110 so that it matches or substantially matches the CTEs of the two glass plates 102 and 112. However, the CTE of the frit 110 does not need to match the CTEs of the glass plates 102 and 112 since experiments have been conducted where soda lime glass plates 102 and 112 with CTE $90 \times 10^{-7}$ per deg C. were sealed with a frit 100 that had CTE $35-40 \times 10^{-7}$ per deg C. In one embodiment, the frit 110 can have a CTE that is less than $40 \times 10^{-7}$ deg C. and the first plate 102 and second plate 112 can have CTEs in a range of $32-90 \times 10^{-7}$ deg C. The compositions of several different exemplary frits 110 which could be used are discussed in detail below with respect to TABLES #1-4.

At step 208 (optional), the frit 110 could be pre-sintered to the first glass plate 102. To accomplish this, the frit 110 which was deposited onto the first glass plate 102 would be heated so that it becomes attached to the first glass plate 102. For instance, the pre-sintering step 208 can be performed by placing the first glass plate 102 and the deposited frit 110 into a furnace where they are heated at 400° C. for 1 hour and then cooled at a controlled rate to prevent the cracking of the frit 110 and the first glass plate 102. If desired, the pre-sintered frit 110 can be ground to reduce its thickness variation to less than 5-10 μm (for example).

At step 210, the liquid 104 is deposited within a space defined by an interior side 118a of the frit 110 and the surface of the first glass plate 102. In one embodiment, the liquid 104 contacts at least the interior side 118a of the frit 110. In another embodiment, the liquid 104 would contact both the interior side 118a and an exterior side 118b of the frit 110 on the first glass plate 102. In this situation, the first glass plate 102 and the frit 110 would at least be partially submerged within the liquid 104.

At step 212 (optional), the components 106 (e.g., OLEDs 106) and associated electrodes 108 are deposited onto the second glass plate 112. This particular step can be omitted if a glass package 100 that contains only a liquid 104 is being made in accordance with the sealing process of the present invention.

At step 214, the second glass plate 112 is placed on top of the frit 110 on the first glass plate 102 such that the liquid 104 remains in the space defined by the interior side 118a of the frit 110 and the surface of the first glass plate 102. If desired, the second glass plate 112 can be placed on top of the frit 110 on the first glass plate 102 such that the components-electrodes 106 and 108 (if present) would be in contact with the liquid 104 which directly contacts the interior side 118a and possibly the exterior side 118b of the frit 110.

At step 216, the frit 110 is heated by the sealing device 116 (e.g., laser 116, infrared lamp 116) in a manner such that the frit 110 forms the seal 114 (e.g., hermetic seal 114) which bonds the first glass plate 102 to second glass plate 112 (see FIG. 1B). The seal 114 also contains the liquid 104 between the first glass plate 102 and the second glass plate 112. In addition, the seal 114 would protect the component(s) 106 (if any) by preventing, for example, the oxygen and moisture located within the ambient environment from entering into the sealed glass package 100.

If desired, the sealing device 116 can be used to emit a light 117 (laser beam 117) that heats the frit 110 in a manner where the temperature of the frit is raised to a substantially constant temperature as the light 117 is moved along the frit 110 (e.g. along a sealing line 120) that has regions free of electrodes 108 and regions occupied by electrodes 108 (if used) while the frit 110 melts and forms the seal 114 which connects the first glass plate 102 to the second glass plate 112. This constant temperature sealing technique is described in more detail after a discussion is provided about some exemplary glass packages 100 and some exemplary frits 110 that can be used to make the glass package 100.

Exemplary Dye Solar Cell 100

Figure 3:
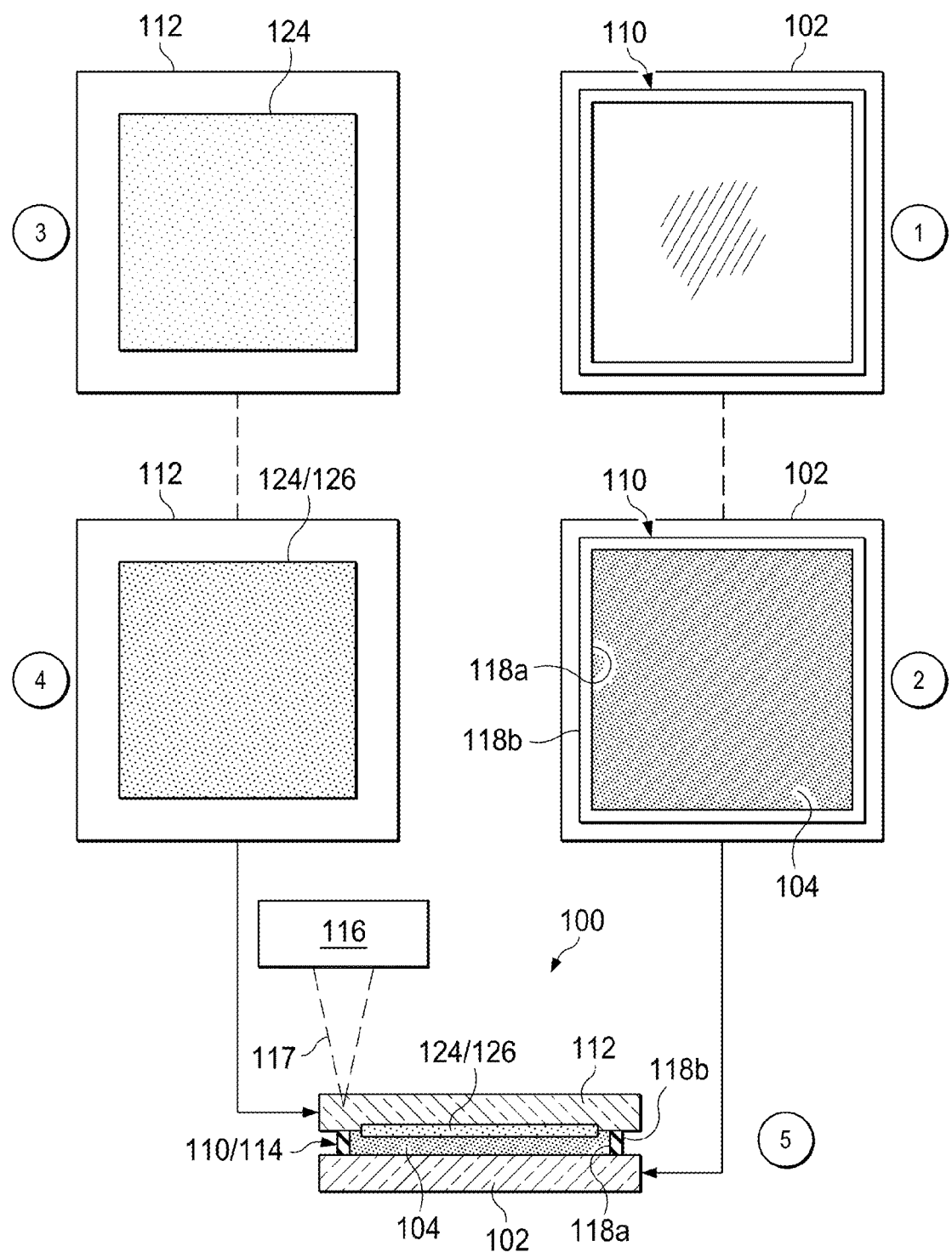
FIG. 3 is a diagram used to help explain an approach about how a dye solar cell (one type of sealed glass package) could be manufactured in accordance with the present invention.

Referring to FIG. 3, there is a diagram that outlines an approach about how the dye solar cell 100 could be produced in accordance with the sealing method 200 of the present invention. First, a glass plate 102 is provided which has been coated with Indium Tin Oxide (ITO) (see reference numeral "1"). In one example, the glass plate 102 could be a transparent glass plate such as a soda lime glass plate or a glass plate that was manufactured by Corning Incorporated under the brand name of Code 1737 glass or Eagle 2000™ glass. The frit 110 (frit paste 110) would be deposited along the edges of the glass plate 102 in a manner that the frit 110 forms a closed-loop on the glass plate 102. For instance, the frit 110 could have a composition of $Sb_2O_3$ (7.4 mole %), ZnO (17.6 mole %), $P_2O_5$ (26.5 mole %), $V_2O_5$ (46.6 mole %), $TiO_2$ (1.0 mole %), and $Al_2O_3$ (1.0 mole %) and at least 30% of β-eucryptite glass-ceramic CTE lowering filler which has a mean particle size of <3 microns. Thereafter, the frit 110 could be pre-sintered to the glass plate 102. For instance, the frit 110 could be pre-sintered so that it becomes attached to the glass plate 102 by placing the glass plate 102 and the deposited frit 110 into a furnace where they are heated at 400° C. for 1 hour and then cooled at a controlled rate.

Second, the conductive liquid 104 is deposited within a space defined by an interior side 118a of the frit 110 and the surface of the glass plate 102 (see reference numeral "2"). As shown, the conductive liquid 104 contacts the interior side 118a of the frit 110. Alternatively, the liquid 104 could contact both the interior side 118a and the exterior side 118b of the frit 110 on the glass plate 102. In this situation, the first glass plate 102 and the frit 110 would at least be partially submerged within the liquid 104.

Third, a glass plate 112 is provided which has been coated with Indium Tin Oxide (ITO) or any other conductive coating such as for example FTO Iron Tin Oxide (see reference numeral "3"). In one example, the glass plate 112 could be a transparent glass plate such as a soda lime glass plate or a glass plate that was manufactured by Corning Incorporated under the brand name of Code 1737 glass or Eagle 2000™ glass. Then, a paste 124 (e.g., Titanium paste 124) is applied to a surface of the glass plate 112. The glass plate 112 and applied paste 124 are sintered to attach the paste 124 to the glass plate 112.

Fourth, a coloring agent 126 (e.g., Ruthenium) may be added to the sintered paste 124 located on the glass plate 112 (see reference numeral "4"). The order of the steps associated with reference numerals 1-2 and 3-4 is not critical since the steps associated with reference numerals 3-4 can be performed either after, before, or at the same time as the steps that are associated with reference numerals 1-2.

Fifth, the glass plate 112 is placed on top of the frit 110 on glass plate 102 such that the liquid 104 remains and air bubbles are not trapped in the space defined by the interior side 118a of the frit 110. Then, a sealing device 116 (e.g., laser 116, infrared lamp 116) emits a beam 117 that heats the frit 110 to form the seal 114 (e.g., hermetic seal 114) which connects the two glass plates 102 and 112. As shown, the sealing device 116 is located above the second glass plate 112 and directs the beam 117 through the second glass plate 112 to heat and melt the frit 110 to attach the two glass plates 102 and 112. Alternatively, the sealing device 116 could be located below the first glass plate 102 and direct the beam 117 through the first glass plate 102 to heat and melt the frit 110 to attach the two glass plates 102 and 112.

For a more detailed discussion about some of the basic components and features of a traditional dye solar cell, reference is made to the following:
1. Bernard Wenger et al. "Rationale for Kinetic Heterogeneity of Ultrafast Light-Induced Electron Transfer from Ru(II) Complex Sensitizers to Nanocrystalline $TiO_2$", Laboratory for Photonics and Interfaces, Institute of Chemical Sciences and Engineering, Ecole Polytechnique Fédérale de Lausanne, 1015 Lausanne, Switzerland, Dec. 31, 2004 (revised manuscript Jul. 23, 2005).
2. Michael Grätzel "Mesoscopic Solar Cells for Electricity and Hydrogen Production from Sunlight" Chemistry Letters Vol. 34, No. 1 (2005).
3. R. Sastrawan et al. "Glass Frit-Sealed Dye Solar Cell Module with Integrated Series Connections", Solar Energy Material and Solar Cells, Volume 90, Issue 11, pp. 1680-1691, Jul. 6, 2006.
4. U.S. Patent Application Publication No. 2006/0160265 A1 entitled "Method of Manufacturing Photoelectric Conversion Element".

The contents of these documents are hereby incorporated by reference herein.

In reviewing these documents it can be appreciated that the sealed glass package 100 and the sealing method 200 of the present invention has several advantages over the prior art. Some of these advantages are listed as follows:

The number of production steps used to make the sealed glass package 100 is greatly reduced which in turn reduces the cost of the sealed glass package 100. In particular, there is no longer a need to seal one or more holes in a glass plate after a liquid has been inserted through the hole(s) into a space between two sealed glass plates.

The repeatability of the sealed glass package 100 is enhanced because the frit 110 enables one to reduce the tolerances in the thicknesses of the materials 106 located within the glass package 100.

The speed of the production of the sealed glass package 100 can be increased using a laser sealing frit process.

The sealing of the glass package 100 with the liquid 104 located therein eliminates the need for special injection devices and costly inspection of the sealed glass package 100. This in turn results in higher yields and lower costs.

Experimental Glass Packages 100

Several experiments have been conducted to seal a liquid 104 within a glass package 100 (which could be a dye solar cell 100, electro-wetting display 100, OLED display 100 etc. . . . ) in accordance with the present invention. These experiments and the results of these experiments are discussed next with respect to FIGS. 4A-4G.

Figure 4A:
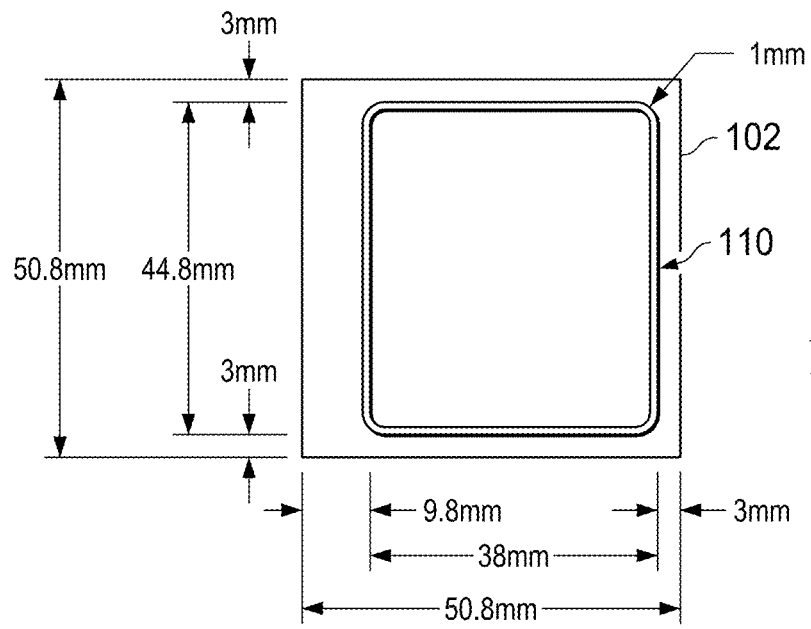
FIGS. 4A-4G illustrate various graphs and photos associated with experimental glass packages that had been sealed in accordance with the present invention.

Referring to FIG. 4A, there is a diagram illustrating the dimensions of an experimental frit glass plate 102 and frit 110 that was used in different experiments to test the sealing of liquids 104 within a glass package 100. In this example, the frit 110 had a height of 50 μm and a diameter of 1 mm. The glass plate 102 used in these experiments included soda lime glass plates and glass plates manufactured by Corning Incorporated under the brand name of Code 1737 glass or Eagle 2000™ glass.

As shown in FIG. 4A, the frit 110 had a closed-loop square pattern with four rounded corners 111 (1 mm radius) which was used in different experiments to determine the range of successful operations that are obtainable during the sealing of two glass plates 102 and 112 in accordance with the present invention. However, the height, thickness, width, diameter and specific composition of the frit 110 happened to be different in many of these experiments. The sealing process in many of these experiments was performed as fast as possible to seal the glass plates 102 and 112 while trying to avoid the boiling of the liquid 104.

Figure 4B:
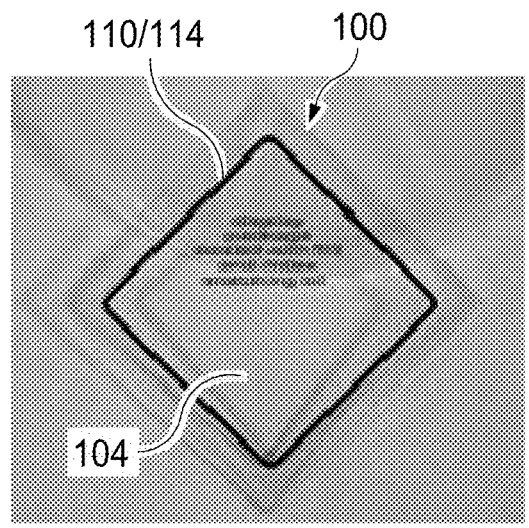
Figure 4C:
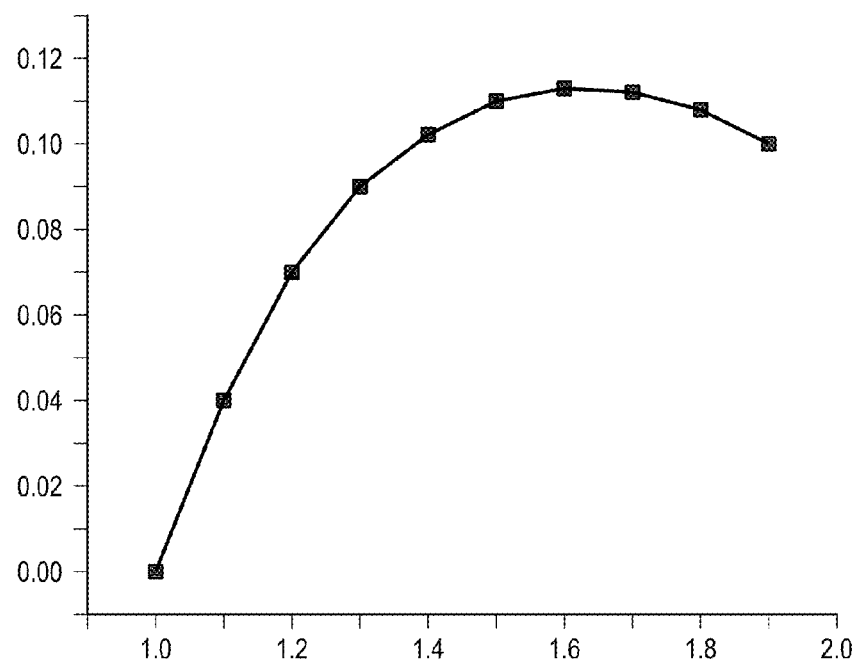
Figure 4D:
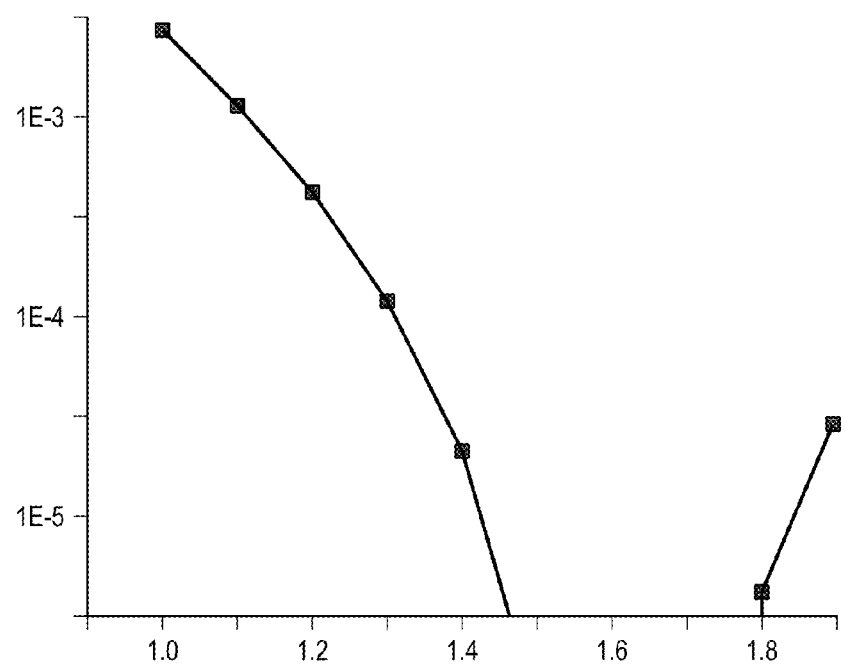

Referring to FIG. 4B, there is a photo of a sealed glass package 100 which had an index matching fluid 104 located therein that was successfully sealed using a laser 116 in accordance with the present invention. By index matching, it is meant that the fluid 104 is selected to have an index of refraction that substantially matches the index of refraction of the second glass substrate 112, in order to minimize the degree of internal reflection and thereby maximize the light output of, for example, a top emission OLED device. In fact, in these experiments several different sealed glass packages 100 where successfully prepared which contained index matching oil, immersion oil, electrolyte iodine solution (with platinum electrodes 108 extending through the frit 110), distilled water, or water with ethylene glycol mixtures (20% to 50% ethylene glycol).

For light extraction it may be more complicated. In an OLED device, the refractive index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions. Most of the light is trapped in ITO, which is not in contact with gap media. Filling the gap reduces reflectivity from the OLED/air and the glass cover/air interface. These extraction improvement values are plotted on the graph shown in FIG. 4C where the x-axis represents "media index" and the y-axis represents "improvement of light extraction".

Improvement of ~10-11% may be expected on top of the extracted 20%, so overall it is 2% of total intensity. But on relative terms 10% improvement is significant. For example, assuming the index of refraction of an OLED device is 1.7 and the index of refraction Corning Eagle glass is 1.55, then the Newton Ring (NR) contrast as function of the refractive index of gap media (e.g. the fluid filling 104 the gap) is plotted on the graph shown in FIG. 4D where the x-axis represents "index of refraction for media" and the y-axis represents "NR contrast. As can be seen, an increase of the index of refraction of the gap media or fluid 104 to 1.45 decreases the Newton Ring visibility by more than 2 orders of magnitude. The range of the index of refraction of the fluid 104 may be from 1.3-1.9. The fluid 104 may be of almost any viscosity. For example, fluids 104 having a relatively high viscosity, such as corn syrup, may be employed, as well as fluids 104 having a relatively low viscosity, such as acetone. The fluid 104 should be selected such that it is compatible with the other materials and the element(s) sealed between the plates 102 and 112. If necessary, a protective layer may be formed over other materials and the element(s) sealed between the plates 102 and 112 to protect them from the index matching fluid 104.

In view of the above, it should be appreciated that the sealing method 200 could be used to seal an OLED display 100 with a liquid 104 that would fill the gap between the glass substrates 102 and 112, thereby supporting the glass substrates 102 and 112 and reducing problematical Newton rings and avoiding problematical sag and touch issues commonly associated with large sized non-liquid containing OLED displays. In particular, the sealing method 200 can reduce Newton rings and avoid sag by ensuring the gas bubbles in the fluid 104 have a total volume such that the sealing step effectively results in a substantially bubble free seal 114. In practice, gas bubbles may be present in the fluid 104 but their volume should be less than a volume change of the gap or space between the glass substrates 102 and 112 and within the frit due to sag or deflection of the glass substrates 102 and/or 112 as a result of variations in the external pressure being applied to the glass substrates, such as variations in the external ambient pressure or by contact with an object such as a finger being pressed against one of the glass substrates.

In all of these experiments, the process was to deposit the liquid 104 so it covered the frit 110 and some of the liquid 104 remained outside of the perimeter of the frit 110 during the sealing process. The laser 116 was used to heat the frit 110 and liquid 104 where the liquid 104 was driven from between the frit 110 and the second glass substrate 112 while the frit 110 melted and formed the hermetic seal 114. For sealing, Eagle 2000™ glass plates 102 and 112, the laser 116 had a sealing speed of 20 mm/s and had a 1.8 mm spot size with the frit 110 being ~0.7 mm wide. The power required for sealing these glass plates 102 and 112 with liquid 104 located therebetween was 37-40 W which was slightly higher than the 33 W of power that was required for sealing the same glass plates without liquid located therebetween. While, for sealing soda lime glass plates 102 and 112, the laser 116 was operated in the range of 38-42 W with a sealing speed of ~2 mm/s and had a beam size of >3.5 mm for a 0.7 or 1.0 mm wide frit 110 (note: these particular sealing conditions where also used in the subsequent experiments that are described below). The sealing was performed by directing the laser beam 117 from either the front or through the back of the frit 110 on the glass plate 102. In all cases, the laser 116 when sealing created a "hot bubble" of liquid 104 that moved together with the laser beam 117 while "extra gas" was escaping from the inside perimeter of the frit 110 until the loop of the hermetic seal 114 was closed. At this point, the sealed glass package 110 had a very minimal gas bubble that was trapped inside of the inner perimeter of the frit 110.

The tested sealing glass packages 100 contained a vanadium frit 110 which had different amounts of β-eucryptite glass-ceramic CTE lowering filler where it was found that a low content of CTE lowering filler in the range of <30% did not necessarily provide a hermetic seal 114 while the frit 110 with at least 30% of the CTE lowering filler did provide a hermetic seal 114. The reason for this is believed to be because the higher amount of CTE lowering filler enhanced the ability of the liquid 104 and liquid vapor created during the sealing process to penetrate the frit 110 and be evaporated out of the interface between the frit 110 and glass plate 112. In contrast, the lower amount of the CTE lowering filler in the frit 110 would cause some of the liquid 104 and liquid vapor to trapped in the interface between frit 110 and the glass plate 112, which is not desirable when sealing the two glass plates 102 and 112. In these experiments, it was determined that the boiling point of the liquid 104 did not play a significant role in the sealing process where water with a 100° C. boiling point was successfully sealed between two glass plates 102 and 112 when the sealing temperature of the frit 110 was >600° C.

The sealed glass packages 100 prepared in these experiments had their hermeticity successfully tested by putting them in a vacuum for approximately one month or on a hot plate (90° C.) for approximately one hour. The heat of the hermetically sealed glass packages 100 on the hot plate up to 95° C. (1 hour) did not break the seal 114 but very significant expansion of what was a "small bubble" at room temperature was observed within the glass package 100. This expansion was reversible where the bubble became small again when the sealed glass packages 100 had been cooled back to room temperature.

Figure 4E:
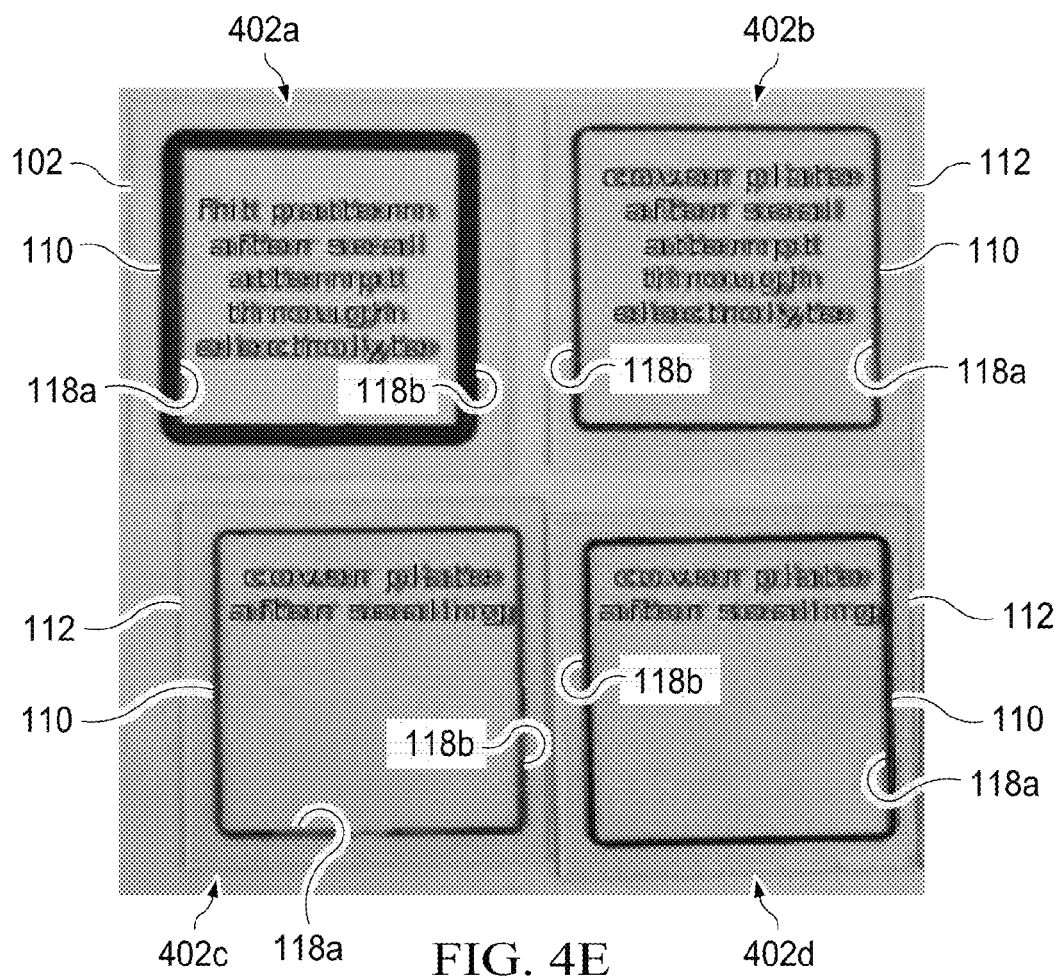

Referring to FIG. 4E, there are photos of one base glass plate 402a (glass plate 102) and three frit cover plates 402b, 402c and 402d (glass plates 112) after their respective sealed glass packages 100 had been ripped apart to show that the frit 110 adhered to both glass plates 102 and 112. In this experiment, if the liquid 104 had interfered with the cover plates 112 ability to seal they would not have contained the frit 110 after being ripped apart from the base plates 102. In viewing these photos, it can be seen that the frit 110 has a bond to two glass plates 102 and 112 that is stronger than the bond the frit 110 has to itself. This was discovered after the glass package 100 was pulled apart and the bonds between the glass plates 102 and 112 and the frit 110 remained intact while the frit 110 separated from itself through the middle of its height dimension. In this experiment, the glass packages 100 where sealed with the liquid 104 (electrolyte 104) in direct contact with both sides 118a and 118b of the frit 110 before, during and after the laser sealing process.

Figure 4F:
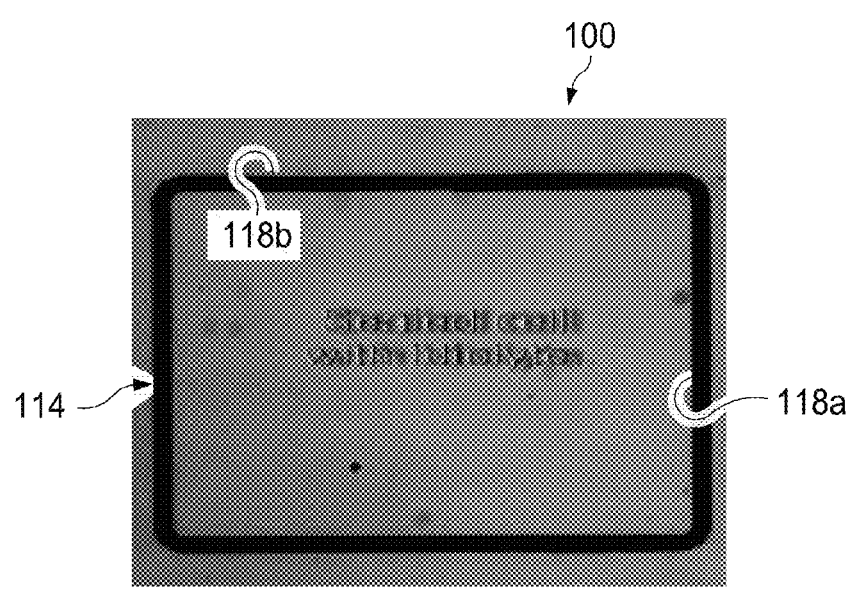
Figure 4G:
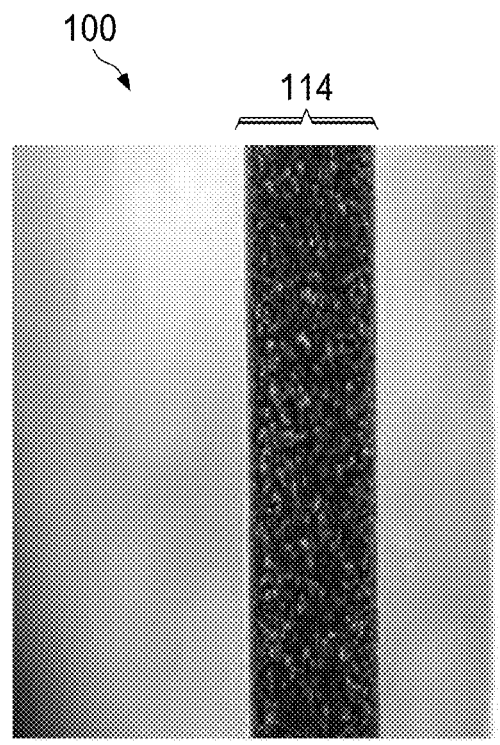

Referring to FIG. 4F, there is a photo of a sealed glass package 100 which contains idiolyte 104 (liquid electrolyte used in photovoltaics) that was sealed in accordance with the present invention. There is also a photo showing a 5× top view of the hermetic seal 114 through one of the glass plates 102 and 112 of the glass package 100. In this experiment, the idiolyte 104 was located on both the inner and outer perimeters 118a and 118b of the frit 110 during the laser sealing process. FIG. 4G is a photo of the side of the sealed glass package 100.

Exemplary Frits 110

In one embodiment, the frit 110 is made from glass doped with one or more transition metals (e.g., vanadium, iron, and/or neodymium) so as to enhance its absorption property at the specific wavelength (e.g., 800 nm wavelength) of the light 117 (laser beam 117) emitted from the sealing device 116 (laser 116)(see FIGS. 1A-1B). This enhancement of the absorption property of the frit 110 means that when the emitted light 117 is absorbed by the frit 110, the frit 110 softens and forms the seal 114 (hermetic seal 114). In contrast, the glass plates 102 and 112 (e.g., Code 1737 glass plates 102 and 112) would be chosen such that they do not absorb irradiation or at least not absorb very much irradiation from the sealing device 116. Thus, the glass plates 102 and 112 would have a relatively low absorption at the specific wavelength of the light 117 which would help to minimize the undesirable transfer of heat from the forming seal 114 (hermetic seal) to the liquid 104 and the components-electrodes 106 and 108 (if present).

The choice and concentration of the transition metal(s) used in the glass frit 110 would be tied to the particular type of sealing device 116, the power of the light 117 and the translation speed of the light 117. In particular, the sealing device 116 that is used should have a light wavelength λ that is within the band of high absorption in the particular frit 110. For instance, the different types of sealing devices 116 that could be used in this sealing process include a semiconductor laser 116 (λ=800-980 nm), Ti:sapphire CW laser 116 (λ=810 nm), a Ytterbium CW laser 116 (900 nm<λ<1200 nm), a Nd:YAG CW laser 116 (λ=1064 nm), a Nd:YALO CW laser 116 (λ=1.08 μm), and an erbium CW laser 116 (λ≈1.5 μm).

The compositions of several different exemplary frits 110 are provided below with respect to TABLES #1-4 all of which where described in detail within a co-assigned U.S. Pat. No. 6,998,776 entitled "Glass Package that is Hermetically Sealed with a Frit and Method of Fabrication". The contents of this document are hereby incorporated by reference herein.

TABLE 1

| Blend make-up (wt. %) | | Composition (mole %) | |
|---|---|---|---|
| Glass frit | Filler | Glass Frit | Filler |
| (80%) | (20%) | $TiO_2$ 20 | $Li_2O$ 25 |
| (mean particle size = 15-20 μm) | (mean particle size = 15-20 μm) | $P_2O_5$ 30 $V_2O_5$ 50 | $Al_2O_3$ 25 $SiO_2$ 50 |
| (70%) | (30%) | $Fe_2O_3$ 12.5 | $Li_2O$ 25 |
| (mean particle size = 15-20 μm) | (mean particle size = 15-20 μm) | $P_2O_5$ 35 $V_2O_5$ 52.5 | $Al_2O_3$ 25 $SiO_2$ 50 |
| (80%) | (20%) | ZnO 20 | $Li_2O$ 25 |
| (mean particle size = 5-10 μm) | (mean particle size = 5-10 μm) | $P_2O_5$ 30 $V_2O_5$ 50 | $Al_2O_3$ 25 $SiO_2$ 50 |

Note 1:

The CTE lowering filler identified above as lithium alumino-silicate is an "additive filler". Alternatively, the frit 110 can use another type of CTE lowering filler such as Co—Mg pyrophosphate which is an "inversion filler" that introduces a dimensional change in the frit 110 through a phase transformation during heating or cooling.

Several other exemplary frits 110 that could be used in the present invention are listed in TABLE #2. These exemplary fits 110 may be desirable since they have a low $T_g$ (i.e., <350° C.) and a low sealing temperature (<550° C.).

TABLE 2

| Description | Sn—Zn-phosphate | Mixed alkali-Zn-phosphate | Vanadium phosphate | Pb-borate | Mixed alkali-Zn-phosphate + V, and Pb |
|---|---|---|---|---|---|
| Typical composition (mole %) | 60% SnO 32% $P_2O_5$ 6% ZnO 2% $B_2O_3$ | 45% ZnO 33% $P_2O_5$ 20% $R_2O$ 2% $Al_2O_3$ | 50% $V_2O_5$ 30% $P_2O_5$ 20% ZnO | 62% PbO 34% $B_2O_3$ 3% $SiO_2$ 1% $Al_2O_3$ | 30% $P_2O_5$ 23% ZnO 20% $R_2O$ 15% PbO 10% $V_2O_5$ 2% $Al_2O_3$ |
| Typical $T_g$ (° C.) | 300° | 325° | 300° | 350° | 310° |
| Furnace sealing temperature | 475-500° | 500°-550° | 425-450° | 500-550° | 500-550° |
| Typical CTE ($10^{-7}$/° C.) | 110 | 130 | 70 | 130 | 140 |

Yet another exemplary frit 110 namely a zinc vanadium phosphate glass frit 110 (e.g., molar basis $20ZnO-30P_2O_5-50V_2O_5$) could be used in the present invention. If desired, the Zn vanadium phosphate frit (molar basis: $20ZnO-30P_2O_5-50V_2O_5$) could include a CTE lowering filler namely β-eucryptite glass-ceramic (molar basis: $25Li_2O-25Al_2O_3-50SiO_2$) as follows (wt. Basis):

frit, (5-10 μm mean particle size) 75% filler (5-10 μm mean particle size) 10% filler (15-20 μm mean particle size) 15%

Still yet another exemplary vanadium frit 110 that could be used in the present invention is listed in TABLES #3 and 4, where all of the elements have been specified in mole %:

TABLE 3

| | vanadium frit 110 |
|---|---|
| $K_2O$ | 0-10 |
| $Fe_2O_3$ | 0-20 |
| $Sb_2O_3$ | 0-20 |
| ZnO | 0-20 |
| $P_2O_5$ | 20-40 |
| $V_2O_5$ | 30-60 |
| $TiO_2$ | 0-20 |
| $Al_2O_3$ | 0-5 |
| $B_2O_3$ | 0-5 |
| $WO_3$ | 0-5 |
| $Bi_2O_3$ | 0-5 |

TABLE 4 list another composition of the vanadium frit 110 which was used in the aforementioned experiments described above with respect to the dye solar cell 100 and other glass packages 100 where the vanadium frit 110 preferably contained at least 30% of a β-eucryptite glass-ceramic additive filler. Both the components making up this particular vanadium frit 110 had a mean particle size of 3 microns.

TABLE 4

| | vanadium frit 110 |
|---|---|
| $Sb_2O_3$ | 7.4 |
| ZnO | 17.6 |
| $P_2O_5$ | 26.5 |
| $V_2O_5$ | 46.6 |
| $TiO_2$ | 1.0 |
| $Al_2O_3$ | 1.0 |

In addition to the aforementioned frit compositions listed in TABLES #1-4, it should be understood that there may be other frit compositions that could be used to seal two glass plates 102 and 112. For instance, the fits 110 disclosed in the co-assigned U.S. Pat. No. 7,407,423 and U.S. Patent Application Publication Nos. 2006-0009109 and 2007-0007894 could be used to seal two glass plates 102 and 112. The contents of these documents are hereby incorporated by reference herein.

Exemplary Sealing Techniques (Step 216)

The sealing technique may comprises the following basic steps:
1. Apply a bead of vacuum grease around the edge of the panel at least 10 mm from the frit
2. Dispense oil on the fritted cover sheet inside the frit line
3. Place back sheet on top of fitted cover sheet, bending at one edge and allowing the oil to flow forward thus minimizing any entrapped air bubbles.
4. Apply pressure to the bead of vacuum grease "sealing" the two sheets together
5. Place assembly in vacuum chamber with a vacuum between 1 and $10 \times 10^{-3}$ Torr for 2 to 5 minutes allowing the air to escape and the oil to flood over the frit line.
6. Laser seal per std condition for the frit type and width The sealing device 116 if desired can be used to heat the frit 110 in a manner where the temperature of the frit is raised to a substantially constant temperature as the sealing device is moved along the frit 110 along a sealing line 120 that has regions free of electrodes 108 and regions occupied by electrodes 108 (if used) which are connected to the components 110 (if used) while the frit 110 melts and forms the seal 114 (e.g., hermetic seal 114) that connects the first glass plate 102 to the second glass plate 112. This can be accomplished by using the sealing techniques disclosed and described in the co-assigned U.S. patent Ser. No. 10/970,319 entitled "Optimization of Parameters for Sealing Organic Emitting Light Diode (OLED) Displays". The contents of this document are hereby incorporated by reference herein.

A number of these sealing techniques have been briefly described below with respect to FIGS. 5A-5G (note: the liquid 104 can not be seen in the particular diagrams which are shown to explain some different exemplary sealing techniques). The following sealing techniques enable the sealing device 116 to raise the temperature of the frit at to a substantially constant temperature as the sealing device moves along frit 110 on the sealing line 120 during the sealing process by taking into account several factors which can affect the rate of the heat diffusion and in turn the temperature of the frit 110 at the sealing point 120. First, the sealing techniques take into account that the typical frit 110 transmission/absorption of light can vary from 2% to 30% depending on its composition and thickness. Secondly, the sealing techniques take into account that the electrodes 108 can have different patterns and depending on their composition can partially absorb or partially reflect the light 117. Thirdly, the sealing techniques take into account that the thermal conductivities of the first and second glass plates 102 and 112 with and without the presence of deposited electrodes 108 can affect the rate of the heat diffusion at the sealing point 120. The different sealing techniques that can ensure the sealing device 116 uniformly heats the frit 110 to the desired sealing temperature along the sealing line 120 which has electrode-free regions 120a and electrode occupied regions 120b are described next with respect to FIGS. 5A-5G.

Figure 5A:
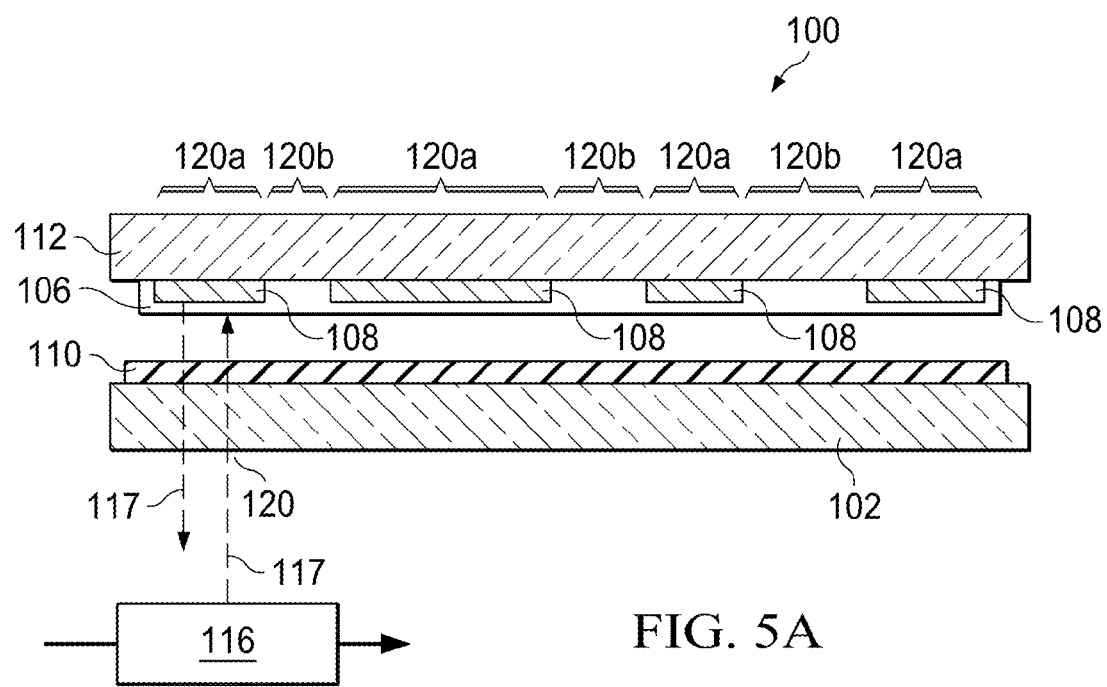
FIGS. 5A-5G are diagrams which are used to help describe different sealing techniques that could be used to seal (hermetically seal) a glass package in accordance with the present invention.

Referring to FIG. 5A, there is a cross-sectional side view of the glass package 100 being sealed (e.g., hermetically sealed) by one of the sealing techniques in accordance with the present invention. In this embodiment, the sealing technique is one where the laser 116 needs to dynamically change the power of the laser beam 117 at different points on the sealing line 120, in order to maintain a substantially constant temperature in the frit 110 along the sealing line 120 which has electrode occupied regions 120a and electrode free regions 120b. For instance, the laser 116 heats the frit 110 to a constant peak temperature in the frit 110 as the laser moves along the sealing line 120 by lowering the power of the laser beam 117 when the electrode 108 occupied regions 120a are present on the sealing line 116 and by increasing the power of the laser beam 118 when the electrode free regions 218b are present on the sealing line 116.

Figure 5B:
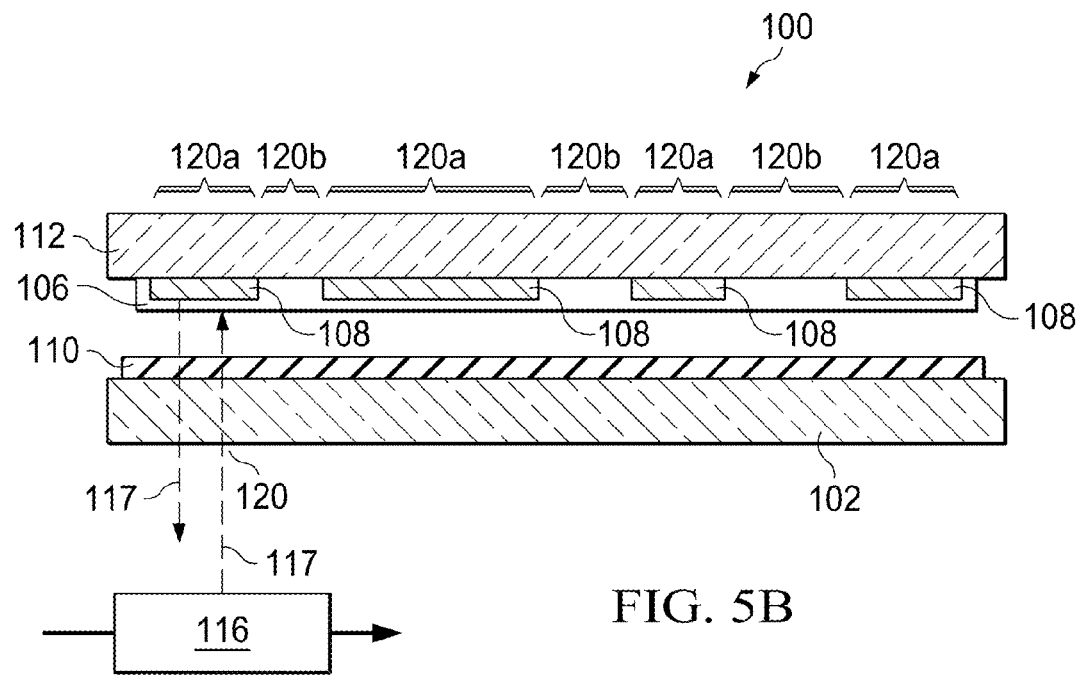

Referring to FIG. 5B, there is a diagram which is used to help describe a second sealing technique that can be used to seal (e.g., hermetically seal) the glass package 100 in accordance with the present invention. In this embodiment, the sealing technique used is one where the laser 116 dynamically changes the speed (v) of the laser beam 117 to heat the frit to a substantially constant temperature as the laser beam moves along the sealing line 120 that has electrode 108 occupied regions 120a and electrode free regions 120b. For instance, the laser 116 can maintain a constant temperature in the frit 110 on the sealing line 120 by moving the laser beam 117 faster when it is over the electrode occupied regions 120a and by moving laser beam 117 slower when it is over electrode free regions 120b. If desired, the laser 116 may move the laser beam 117 at a third intermediate speed in the areas where there are electrodes 108 in close proximity to the sealing line 120. This process can be implemented regardless of whether the electrodes 108 are highly absorptive and/or highly reflective. Alternatively, instead of moving the laser 116 over a stationary glass package 100, a stage/support (not shown) which holds the glass package 100 could be moved at different speeds under a stationary laser 116 to maintain a constant temperature within the frit 110 (note: this particular set-up can be used for any of the sealing techniques described herein).

Figure 5C:
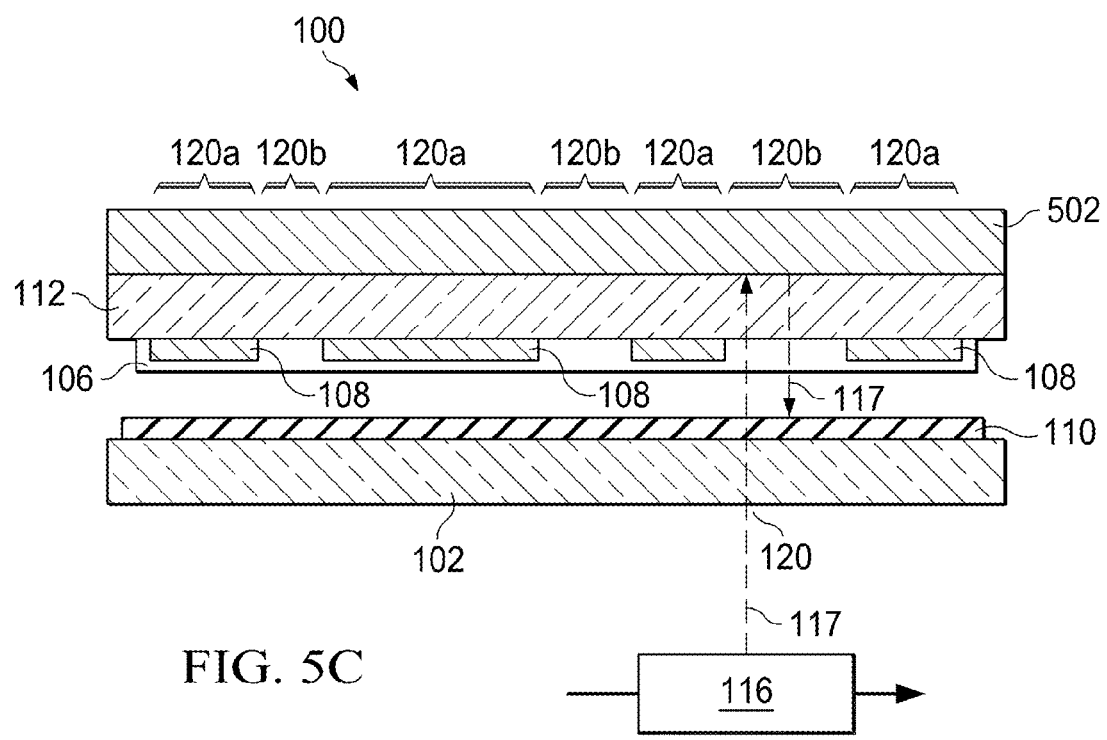

Referring to FIG. 5C, there is a cross-sectional side view of the glass package 100 being sealed (e.g., hermetically sealed) by yet another one of the sealing techniques in accordance with the present invention. In this embodiment, the sealing technique is one where a high reflector 502 (e.g., mirror 502) is placed on the second glass plate 112 while the laser 116 emits the laser beam 117 to melt the frit 110 and form the seal 114 (hermetic seal 114). The high reflector 502 helps to balance the power absorbed by the frit 110 regardless of whether the frit 110 is located under electrode occupied regions 120a or electrode free regions 120b. For example, the temperature rise in the frit 110 at different points along the sealing line 120 can be represented as follows:

At the electrode 108 occupied regions 120a:

$$T(\text{frit})1 = P/a^2 \text{sqrt}(vD)(\epsilon(\text{frit}) + (1-\epsilon(\text{frit})e(\text{electrode}) + (1\epsilon\text{frit})R(\text{electrode})e(\text{frit}))$$

And, at the electrode free regions 120b $$T(\text{frit})2 = P/a^2 \text{sqrt}(vD)(\epsilon(\text{frit}) + (1-\epsilon(\text{frit}))*R(\text{reflector}) * \epsilon(\text{frit}))$$

where the T(frit) is temperature rise in the frit 110, P is laser power of the laser 116, v is laser translation speed, a is the laser spot size, D is heat diffusivity in the second glass plate 112, $\epsilon$ (frit) is percentage of the laser power absorbed by frit 110 on the first path, R(electrode) is reflectivity of the electrode 108 and e(electrode) is the percentage of laser power absorbed by electrode 108. As can be seen, it is possible to decrease the difference T(frit)1−T(frit)2 by using the high reflector 502. The difference would depend on the optical parameters and properties of the electrodes 108. It should be appreciated that in this sealing technique, the power and/or speed of the laser beam 117 can be maintained at a constant or be dynamically changed.

Figure 5D:
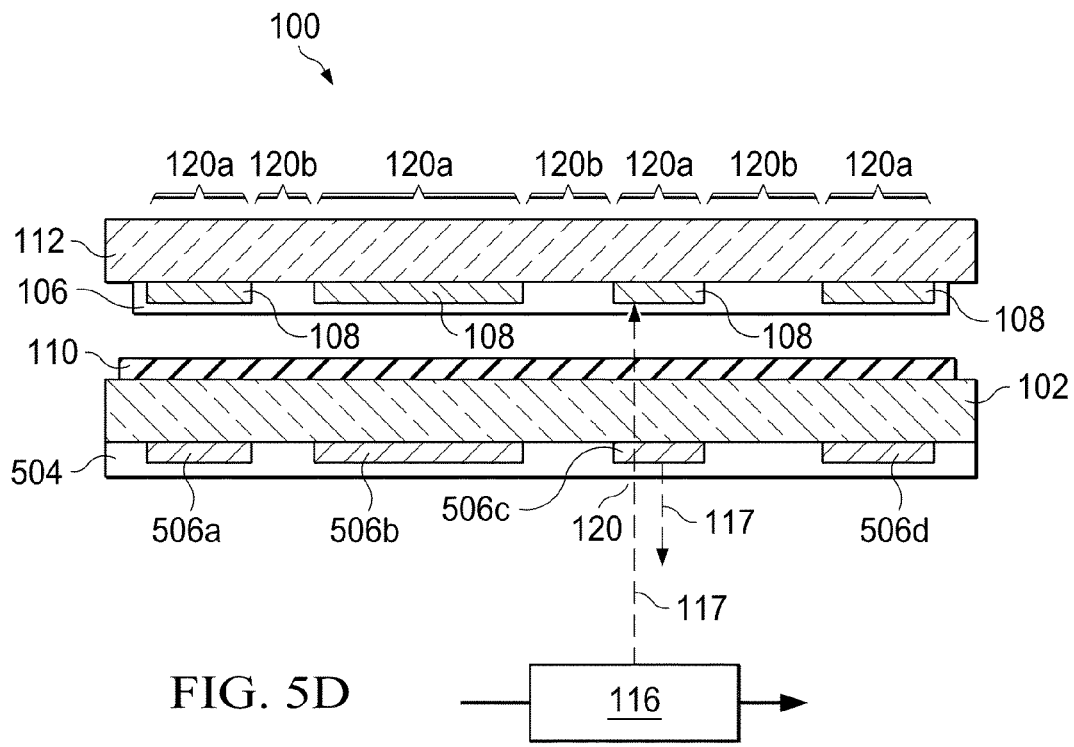

Referring to FIG. 5D, there is a cross-sectional side view of the glass package 100 being sealed (e.g., hermetically sealed) by yet another one of the sealing techniques in accordance with the present invention. In this embodiment, the sealing technique is one where a partially reflective mask 504 is placed on the first glass plate 102 while the laser 116 emits the laser beam 117 to melt and form the seal 114 (hermetic seal 114). The partially reflective mask 504 has different patterns 506a, 506b . . . 506d that represent different reflectivities of the mask 504 to compensate for the different properties of electrodes 108. In this way, the partially reflective mask 504 helps to balance the power absorbed by the frit 110 regardless of whether the frit 110 is located over electrode occupied regions 120a or electrode free regions 120b.

Figure 5E:
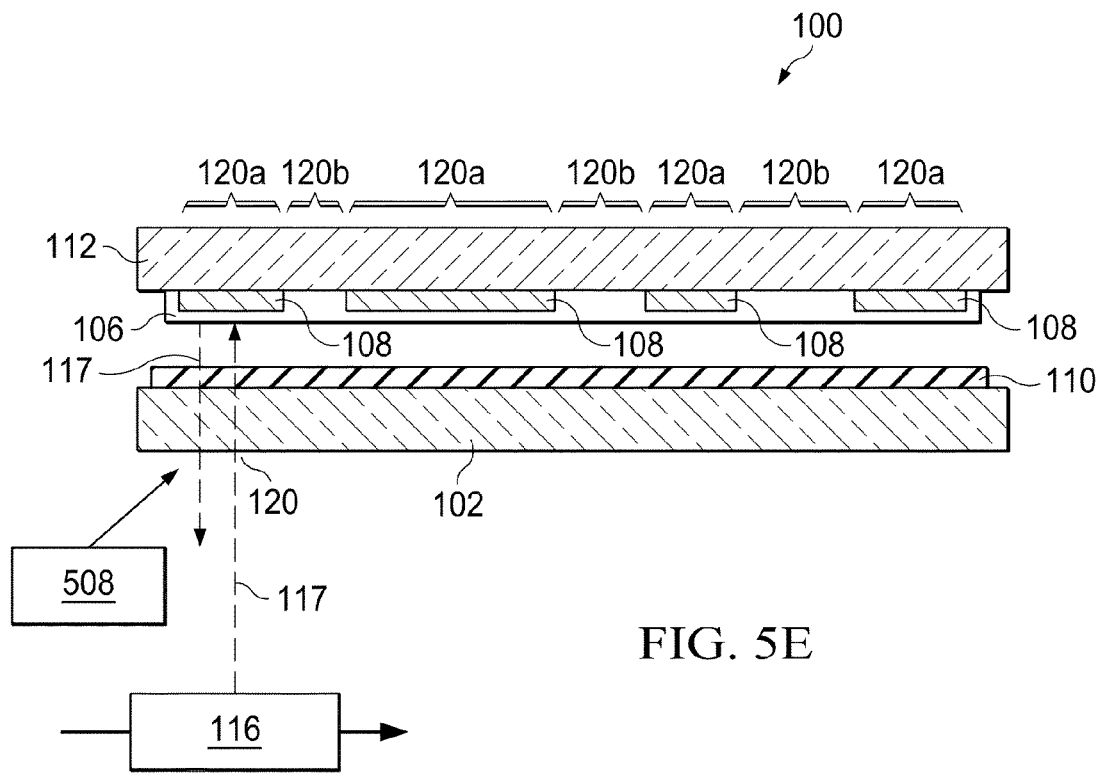

Referring to FIG. 5E, there is a cross-sectional side view of the glass package 100 being sealed (e.g., hermetically sealed) by yet another one of the sealing techniques in accordance with the present invention. In this embodiment, the sealing technique is one where the laser 116 seals at least a part of the frit sealing line 120 in a first pass at the lowest power corresponding to the right sealing temperature along the line 120 and then finishes the sealing of the line 120 in a second pass at a higher power only at places which failed to reach the correct temperature during the first pass. A feedback mechanism 508 the same as or similar to the one described below may be used to determine which sections of the frit 110 did not reach the correct temperature during the first pass.

Figure 5F:
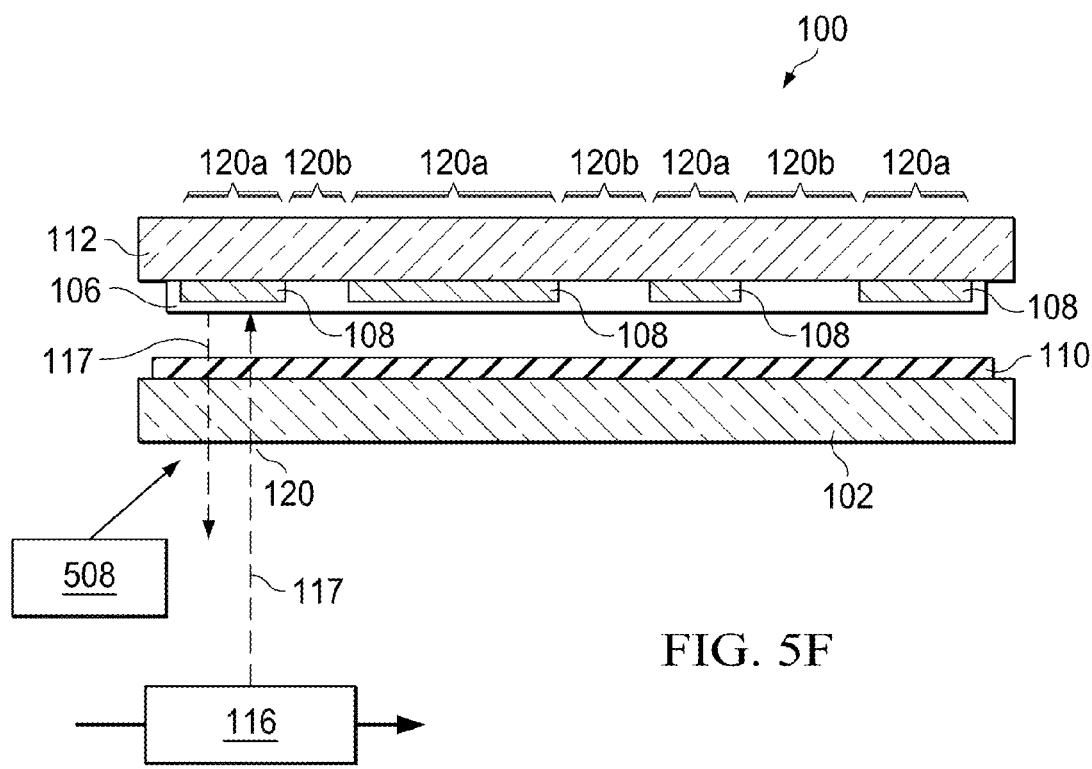

Referring to FIG. 5F, there is a cross-sectional side view of the glass package 100 being sealed (e.g., hermetically sealed) by yet another one of the sealing techniques in accordance with the present invention. In this embodiment, the sealing technique is one that uses a feedback mechanism 508 to help ensure there is uniform heating within the frit 110 along the sealing line 120 during the formation of the seal 114 (e.g., hermetic seal 114). The feedback mechanism 508 can be used to monitor the hot spot intensity of the sealing line 120 at a certain fixed wavelength. The hot spot originates from black body emission due to the temperature rise along the sealing line 120 because of the heating by the laser 116. The emission spectrum is very broad and almost any of the wavelengths from 500-2000 nm could be used for this purpose. In one embodiment, the feedback mechanism 508 monitors the on-line emission intensity, converts it to a temperature and optimizes one or more sealing parameters (e.g., power, speed of laser beam 117) to ensure the elevated peak temperature is uniform along the sealing line 120 regardless of whether the frit 110 is over electrode occupied regions 120a or over electrode free regions 120b. For instance, the feedback mechanism 508 can be used to help control the power of the laser 116 to make the temperature uniform along the sealing line 120 regardless of whether the frit 110 is over the electrode occupied regions 120a or the electrode free regions 120b. In fact, there are many different ways one can use the feedback mechanism 508 some of which are described below:

The feedback mechanism 508 can monitor the temperature at different locations on the sealing line 120 while the laser 116 seals an unknown sample glass package 100. The feedback mechanism 508 modifies the laser speed or power at certain locations along the sealing line 120 in order to keep the temperature constant within the frit 110 while sealing the sample glass package 100. The laser 116 can then apply these conditions to seal similar glass packages 100.

The feedback mechanism 508 can "actively" monitor the temperature at different locations on the sealing line 120 while the laser 116 seals the glass package 100. The feedback mechanism 508 also modifies the laser speed or power at certain locations along the sealing line 120 to keep the elevated peak temperature constant along the frit 110 while sealing the glass package 100.

Figure 5G:
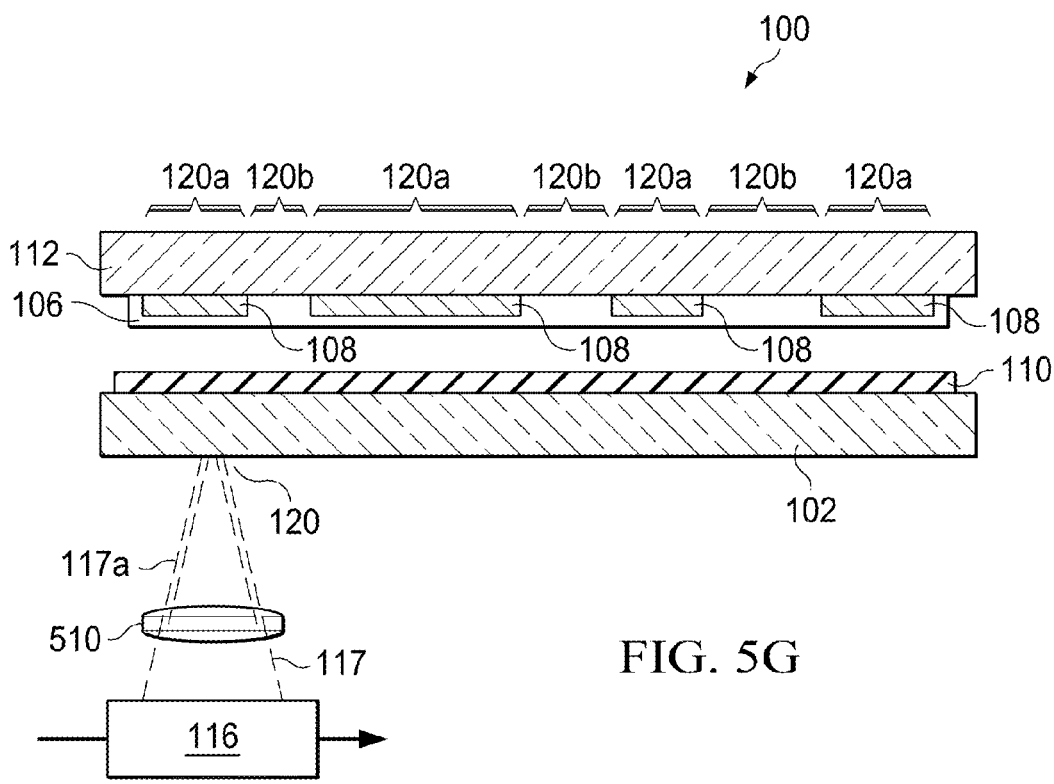

Referring to FIG. 5G, there is a cross-sectional side view of the glass package 100 being sealed (e.g., hermetically sealed) by yet another one of the sealing techniques in accordance with the present invention. In this embodiment, the sealing technique is one where the beam profile of the laser beam 117 is modified by a circular aperture 510 (or other specially shaped aperture 510) located at the end of the laser 116. The circular aperture 510 is sized to modify the laser beam 117 by blocking/defocusing a portion of that beam 117 such that the modified laser beam 117a heats the frit 110 along the sealing line 120 of the glass package 100. Basically, the circular aperture 510 or lens modifies the Gaussian shape of the laser beam 117 by clipping the tails of the emitted laser beam 117. The defocused laser beam 117a also has a reduced 1/e power level that can provide the needed coverage and needed power at the sealing line 120 while at the same time not to expose any of the components 106 (if any) inside of the frit line 120 to extra heat generation which can permanently damage of the glass package 100. In an alternative embodiment, the circular aperture 510 can have a blocking circle (not shown) located in the middle thereof to make the laser beam 117 have the shape of an elliptical beam that helps make the temperature uniform over the frit 110 which typically has more heat diffusion at its edges. The elliptical-shaped laser beam 117 not only causes uniform heating across the frit 110 but also enables gradual heating and cooling along the frit 110 which helps to reduce residual stress.

It should be appreciated that more than one of the aforementioned sealing techniques could be used at the same time to melt the frit 110 to form the seal 114 (e.g., hermetic seal 114) that bonds the glass package 100. For instance, the glass package 100 can be sealed by using the sealing techniques described above with respect to changing the power of the laser 116 (see FIG. 5A) and with using the circular aperture 510 to modify the shape of the laser beam 117 (see FIG. 5G). In addition, the laser 116 could emit the laser beam 117 through the second glass plate 112 to heat the frit 110 instead of through the first glass plate 102.

Although multiple embodiments of the present invention have been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

The invention claimed is:

1. A glass package comprising:
   a first glass plate having a composition, thickness, coefficient of thermal expansion and an index of refraction; and
   a second glass plate having a composition, thickness, coefficient of thermal expansion and an index of refraction,
   a conductive liquid having an third index of refraction,
   a frit having a composition, thickness, coefficient of thermal expansion, a glass transition temperature and a sealing temperature, and comprising a glass doped with at least one transition metal and having a coefficient of thermal expansion that substantially matches the coefficient of thermal expansion of at least the first glass plate or second glass plate,
   wherein the first glass plate and the second glass plate are connected to one another by the frit which forms a seal between the first glass plate and the second glass plate and the frit, first glass plate, and second glass plate together form a sealed space that contains the conductive liquid.

2. The glass package of claim 1, wherein the coefficient of thermal expansion of the first glass plate or the second glass plate is from about $32\text{-}90 \times 10^{-7}$ deg C.

3. The glass package of claim 1, wherein the first plate and the second plate have different compositions, thicknesses, or CTEs.

4. The glass package of claim 1, wherein the index of refraction of the conductive liquid substantially matches the index of refraction of the second glass plate.

5. The glass package of claim 1, wherein the conductive liquid comprises index matching oil, immersion oil, electrolyte iodine solution, distilled water, or 20-50% ethylene glycol-water.

6. The glass package of claim 1, wherein the index of refraction of the conductive liquid is from about 1.3 to about 1.9.

7. The glass package of claim 1, further comprising a conductive coating on the first glass sheet or the second glass sheet.

8. The glass package of claim 1, wherein the frit has a glass transition temperature, $T_g$ of <350° C.

9. The glass package of claim 8, wherein the frit has a sealing temperature of <550° C.

10. The glass package of claim 9, wherein said frit has a CTE of from about $40\text{-}80 \times 10^{-7}$ deg C.

11. The glass package of claim 1, wherein the frit comprises glass particles having a mean particle size of 5-20 μm.

12. The glass package of claim 1, wherein the thickness of the frit varies by less than 5-10 μm.

13. The glass package of claim 1, wherein the frit is selected from the group of glasses comprising a titano-vanadium glass, an iron-vanadium glass, a zinc-vanadium glass, a Sn—Zn-phosphate glass, a mixed alkali zinc-phosphate glass, a vanadium-phosphate glass, a Pb-borate glass, and a mixed alkali zinc-phosphate glass with vanadium and lead.

14. The glass package of claim 1, wherein the composition of the frit comprises:
   $K_2O$ (0-10 mole %);
   $Fe_2O_3$ (0-20 mole %);
   $Sb_2O_3$ (0-20 mole %);
   $ZnO$ (0-20 mole %);
   $P_2O_5$ (20-40 mole %);
   $V_2O_5$ (30-60 mole %);
   $TiO_2$ (0-20 mole %);
   $Al_2O_3$ (0-5 mole %);
   $B_2O_3$ (0-5 mole %);
   $WO_3$ (0-5 mole %); and
   $Bi_2O_3$ (0-5 mole %).

15. The glass package of claim 1, wherein the frit further comprises a coloring agent.

16. The glass package of claim 1, wherein the frit comprises at least 20-30% filler and has a CTE that is in a range of $40\text{-}80 \times 10^{-7}$ deg C.

17. The glass package of claim 16, wherein the filler comprises a coefficient of thermal expansion (CTE) lowering filler.

18. The glass package of claim 17, wherein the frit is selected from the group of glasses comprising a titano-vanadium glass, an iron-vanadium glass, a zinc-vanadium glass, a Sn—Zn-phosphate glass, a mixed alkali zinc-phosphate glass, a vanadium-phosphate glass, a Pb-borate glass, and a mixed alkali zinc-phosphate glass with vanadium and lead.

19. The glass package of claim 17, wherein the frit composition, excluding the CTE lowering filler, comprises:
   $K_2O$ (0-10 mole %);
   $Fe_2O_3$ (0-20 mole %);
   $Sb_2O_3$ (0-20 mole %);
   $ZnO$ (0-20 mole %);
   $P_2O_5$ (20-40 mole %);
   $V_2O_5$ (30-60 mole %);
   $TiO_2$ (0-20 mole %);
   $Al_2O_3$ (0-5 mole %);
   $B_2O_3$ (0-5 mole %);
   $WO_3$ (0-5 mole %); and
   $Bi_2O_3$ (0-5 mole %).

20. The glass package of claim 1, wherein said glass package comprises:
   a solar cell;
   an electro-wetting display; or
   an organic emitting light diode device.

* * * * *